(12) United States Patent
Leobandung

(10) Patent No.: US 10,303,998 B2
(45) Date of Patent: May 28, 2019

(54) FLOATING GATE FOR NEURAL NETWORK INFERENCE

(71) Applicant: International Business Machines Corporation, Armonk, NY (US)

(72) Inventor: Effendi Leobandung, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/718,078

(22) Filed: Sep. 28, 2017

(65) Prior Publication Data

US 2019/0095779 A1 Mar. 28, 2019

(51) Int. Cl.
| | |
|---|---|
| G11C 16/26 | (2006.01) |
| G11C 16/04 | (2006.01) |
| G11C 7/00 | (2006.01) |
| G06N 3/04 | (2006.01) |
| G11C 11/16 | (2006.01) |
| G11C 15/04 | (2006.01) |
| G11C 7/10 | (2006.01) |

(52) U.S. Cl.
CPC ........... *G06N 3/0445* (2013.01); *G11C 16/04* (2013.01); *G11C 16/26* (2013.01); *G11C 7/00* (2013.01); *G11C 7/1006* (2013.01); *G11C 11/1673* (2013.01); *G11C 15/046* (2013.01)

(58) Field of Classification Search
CPC ....... G06N 3/0445; G11C 16/04; G11C 16/26
USPC ...................................... 706/15; 365/185.15
See application file for complete search history.

(56) References Cited

U.S. PATENT DOCUMENTS

| | | | | |
|---|---|---|---|---|
| 4,903,265 | A * | 2/1990 | Shannon | G11C 16/14 365/201 |
| 5,132,935 | A * | 7/1992 | Ashmore, Jr. | G11C 16/10 365/185.06 |
| 5,452,248 | A * | 9/1995 | Naruke | G11C 16/16 257/E27.103 |
| 6,172,368 | B1 * | 1/2001 | Tarr | G01T 1/026 250/337 |
| 6,434,051 | B1 | 8/2002 | Endo | |
| 6,606,273 | B1 * | 8/2003 | Guo | G11C 29/006 365/185.24 |
| 6,870,764 | B2 | 3/2005 | Owen | |
| 6,903,979 | B1 | 6/2005 | Mirgorodski et al. | |
| 7,339,835 | B1 | 3/2008 | Mirgorodski et al. | |
| 7,493,353 | B2 | 2/2009 | Ueda et al. | |
| 7,656,710 | B1 * | 2/2010 | Wong | G11C 11/5628 365/185.19 |

(Continued)

OTHER PUBLICATIONS

Mel, et al. "The NIST Definition of Cloud Computing", Recommendations of the National Institute of Standards and Technology. Nov. 16, 2015.

*Primary Examiner* — Ly D Pham
(74) *Attorney, Agent, or Firm* — L Jeffrey Kelly, Esq.; McGinn IP Law Group, PLLC

(57) ABSTRACT

A floating gate setup method, system, and computer program product include, in an initial setup of weights for a floating gate including rows, columns, and a separate input line: comparing a current weight to a desired weight, performing a feedback to the input line to set a voltage to change the floating gate FET VT and the current weight, and checking that the current weight is within a predetermined tolerance of the desired weight.

18 Claims, 5 Drawing Sheets

(56) References Cited

U.S. PATENT DOCUMENTS

| | | | |
|---|---|---|---|
| 9,230,656 B2 * | 1/2016 | Avila | G11C 16/0483 |
| 9,543,016 B1 | 1/2017 | Jin | |
| 2003/0235080 A1 * | 12/2003 | Yaegashi | G11C 16/0466 |
| | | | 365/185.22 |
| 2005/0005055 A1 * | 1/2005 | Pasotti | G11C 16/30 |
| | | | 711/1 |
| 2007/0183215 A1 * | 8/2007 | Sugawara | G11C 16/12 |
| | | | 365/185.24 |
| 2007/0195597 A1 * | 8/2007 | Park | G11C 11/5628 |
| | | | 365/185.03 |
| 2009/0273981 A1 * | 11/2009 | Moschiano | G11C 16/10 |
| | | | 365/185.19 |
| 2012/0063227 A1 * | 3/2012 | Weingarten | G11C 11/5628 |
| | | | 365/185.09 |
| 2016/0085626 A1 | 3/2016 | Nishi et al. | |
| 2016/0141337 A1 * | 5/2016 | Shimabukuro | H01L 27/2481 |
| | | | 365/51 |

* cited by examiner

FLOATING GATE FOR NEURAL NETWORK INFERENCE

BACKGROUND

The present invention relates generally to a floating gate setup method applicable on an non-volatile memory (NVM) floating gate, and more particularly, but not by way of limitation, to a system, method, and computer program product for setting up all of the weights (e.g., stored charge and threshold value of floating gate) in the layers and also on other layers of the floating gate.

Neural Networks are the leading method to implement Machine learning and training for cognitive computing. Neural Networks can be implemented at a software level but more efficiently in hardware such as with a cross bar implementation with variable resistance as a weighting mechanism. Many type of weights have been proposed. None of the proposed weights is best during training since they are not symmetric. However, for inference purposes, the weights need to be updated once and do not have to be symmetric. Inference has to be cheap and low power to be installed in an end user system such as a smart phone, automotive, Internet-of-Things (IoT) devices, camera, etc.

SUMMARY

In an exemplary embodiment, the present invention can provide a computer-implemented floating gate setup method on a floating gate, the method including in an initial setup of weights for a floating gate including rows, columns, and a separate input line: comparing a current weight to a desired weight, performing a feedback to the input line to set a voltage to change the floating gate FET VT and the current weight, and checking that the current weight is within a predetermined tolerance of the desired weight. One or more other exemplary embodiments include a computer program product and a system.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

Figure 1:
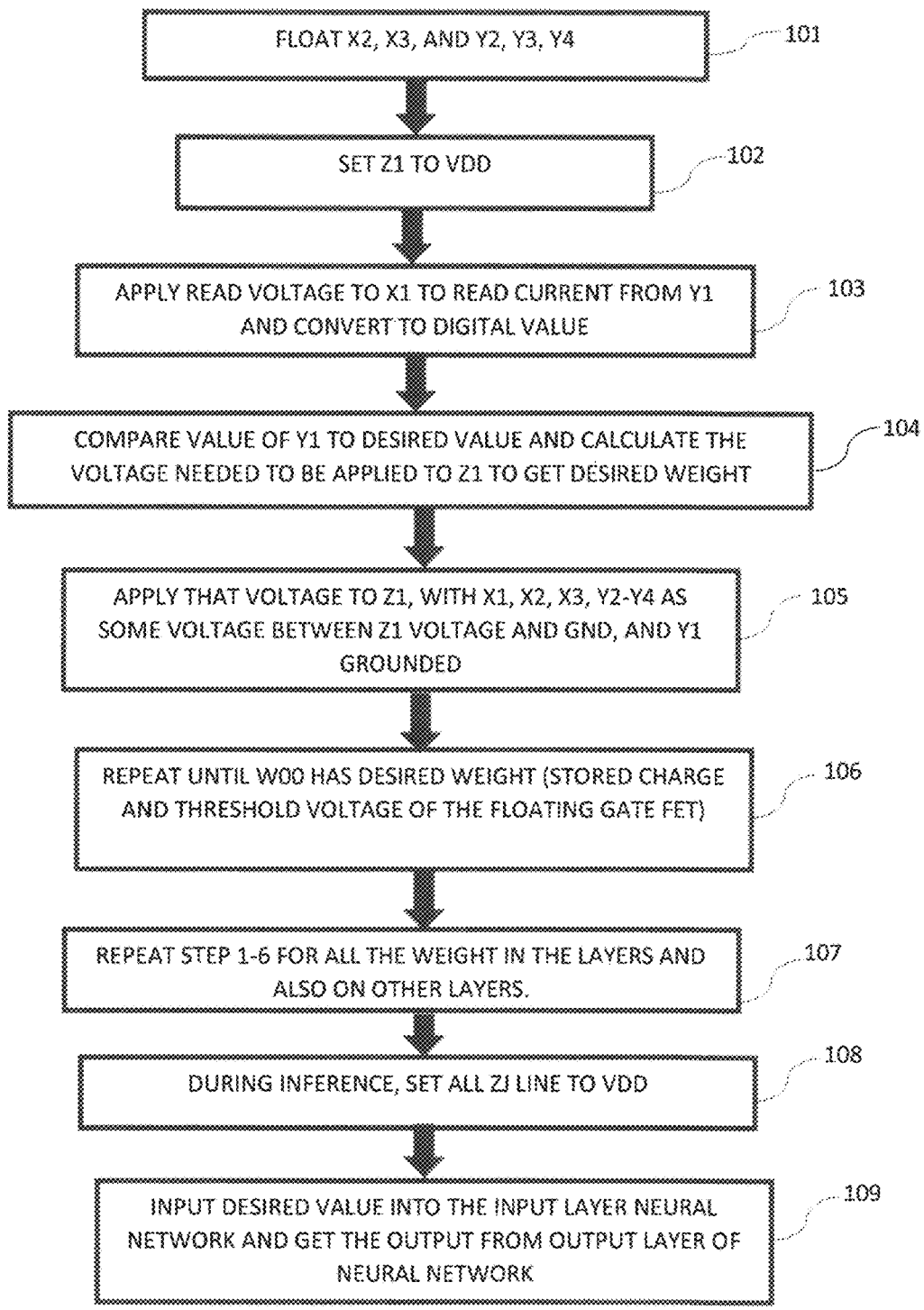
FIG. 1 exemplarily shows a high-level flow chart for a floating gate setup method 100 according to an embodiment of the present invention.

The invention will now be described with reference to FIGS. 1-5, in which like reference numerals refer to like parts throughout. It is emphasized that, according to common practice, the various features of the drawings are not necessarily to scale. On the contrary, the dimensions of the various features can be arbitrarily expanded or reduced for clarity.

By way of introduction of the example depicted in FIG. 1, an embodiment of a floating gate setup method 100 according to the present invention can include various steps for using an NVM floating gate for inference purposes.

Figure 3:
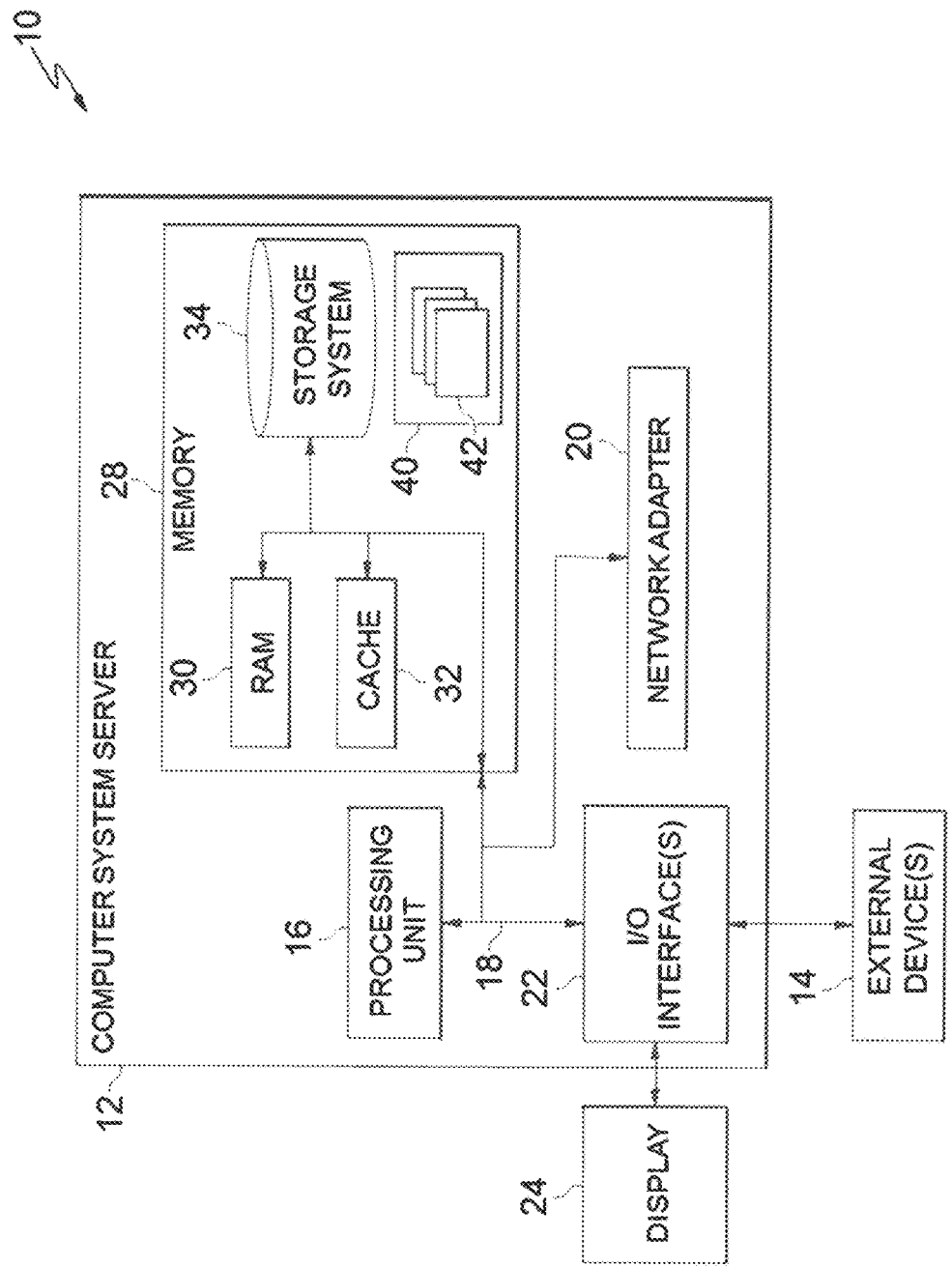
FIG. 3 depicts a cloud-computing node 10 according to an embodiment of the present invention.

By way of introduction of the example depicted in FIG. 3, one or more computers of a computer system 12 according to an embodiment of the present invention can include a memory 28 having instructions stored in a storage system to perform the steps of FIG. 1.

Figure 2:
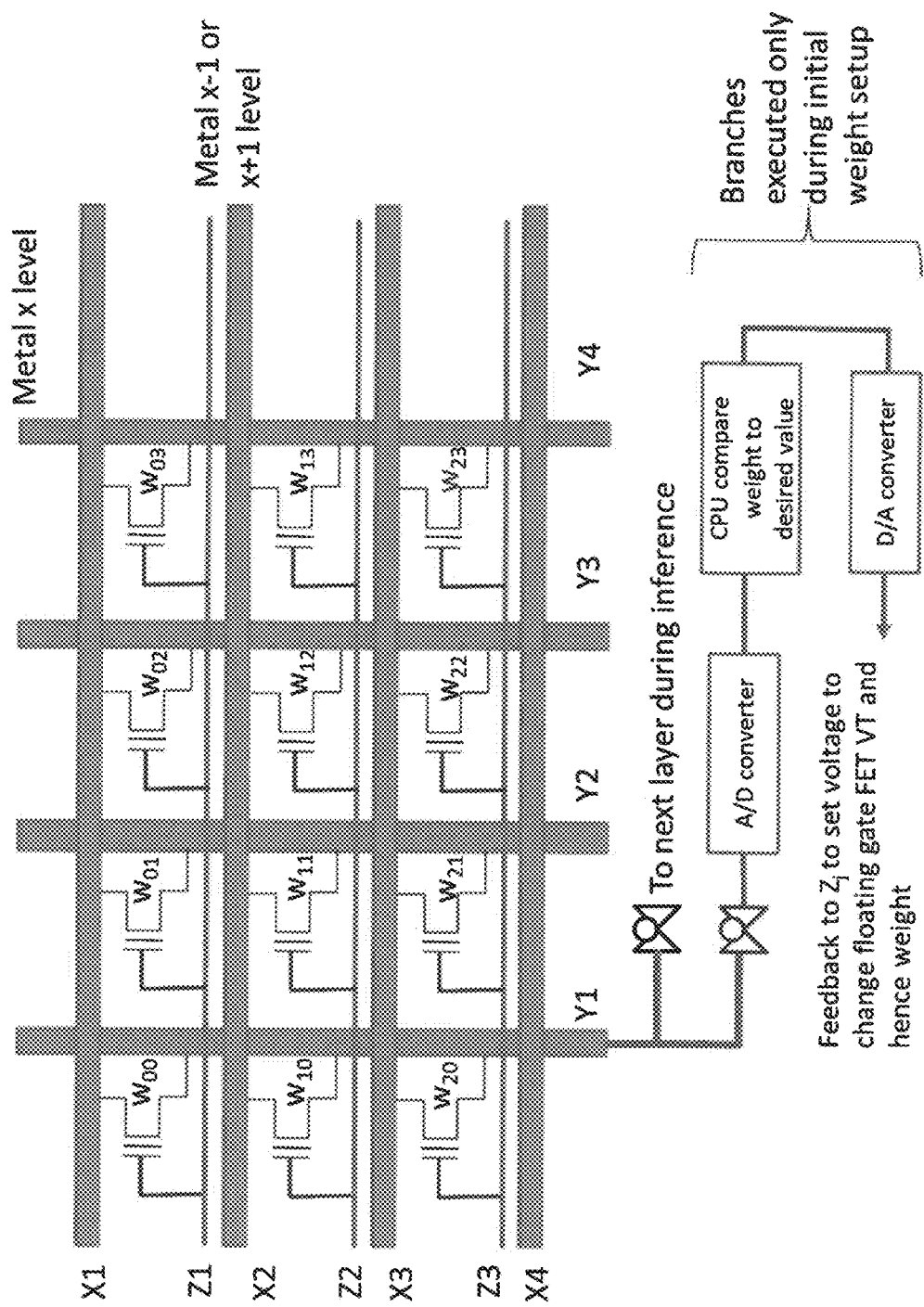
FIG. 2 exemplarily depicts a circuit representing an input layer according to an embodiment of the present invention.

Referring to FIG. 2, input lines Z1-ZN include the inputs into the circuit, X1-XN are the rows, Y1-YN are the columns, $W_{00}$-$W_{NO}$ are the weights, and the circuit is connected to an analog to digital (A/D) converter, a central processing unit (CPU) to compare weight to a desired value and a D/A converter for a feedback to Zj to set voltage to change floating gate field effect transistor (FET) VT and the weight. FIG. 2 exemplarily depicts a cross bar configuration for an analog memory.

Referring generally to FIG. 1 and FIG. 2, steps 101-107 correspond to an initial weight setup for the circuit representing the input layer (i.e., the floating gate) and steps 108-109 correspond to operation during inference.

In step 101, lines X2, X3, and column lines Y2, Y3, and Y4 are floated. That is, there is no direct connection of rows and columns. This is performed so that voltage V does not affect the structure. Then in step 102, line Z1 is set to VDD. In step 103, a row read voltage is applied to line X1 to read current from line Y1 and convert the current to a digital value. This is a floating gate value. Then, in step 104, the value of line Y1 is compared to a desired value and the voltage needed to be applied to Z1 to get desired weight is calculated. In step 105, that voltage is applied to line Z1, with lines X1, X2, X3, Y2-Y4 as some voltage between line Z1 voltage and GND, and Y1 grounded. In step 106, step 105 is repeated until w00 has a desired weight (e.g., stored charge and threshold voltage (VT) of the floating gate FET). In step 107, steps 101-106 are repeated for all the weight in the layers and also on other layers.

In steps 108 and 109, during inference, all the input Zj lines are set to VDD and a desired value is input into the input layer of a neural network and the output from an output layer of neural network is obtained.

Thus, steps 101-109 can provide a floating gate for a neural network with a feedback loop, a floating gate for an analog memory storage for a neural network, and/or a stochastic pulse update on a floating gate.

Therefore, the embodiments described here in may provide am NVM Floating gate that can be cheaply fabricated (same process used in Flash Memory), with low power, simple circuit implementation, and non volatile.

Exemplary Aspects, Using a Cloud Computing Environment

Although this detailed description includes an exemplary embodiment of the present invention in a cloud computing environment, it is to be understood that implementation of the teachings recited herein are not limited to such a cloud computing environment. Rather, embodiments of the present invention are capable of being implemented in conjunction with any other type of distributed computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client circuits through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 3, a schematic of an example of a cloud computing node is shown. Cloud computing node 10 is only one example of a suitable node and is not intended to suggest any limitation as to the scope of use or functionality of embodiments of the invention described herein. Regardless, cloud computing node 10 is capable of being implemented and/or performing any of the functionality set forth herein.

Although cloud computing node 10 is depicted as a computer system/server 12, it is understood to be operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop circuits, multiprocessor systems, microprocessor-based systems, set top boxes, programmable consumer electronics, network PCs, minicomputer systems, mainframe computer systems, and distributed cloud computing environments that include any of the above systems or circuits, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing circuits that are linked through a communications network. In a distributed cloud computing environment, program modules may be located in both local and remote computer system storage media including memory storage circuits.

Referring now to FIG. 3, a computer system/server 12 is shown in the form of a general-purpose computing circuit. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further described below, memory 28 may include a computer program product storing one or program modules 42 comprising computer readable instructions configured to carry out one or more features of the present invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may be adapted for implementation in a networking environment. In some embodiments, program modules 42 are adapted to generally carry out one or more functions and/or methodologies of the present invention.

Computer system/server 12 may also communicate with one or more external devices 14 such as a keyboard, a pointing circuit, other peripherals, such as display 24, etc., and one or more components that facilitate interaction with computer system/server 12. Such communication can occur via Input/Output (I/O) interface 22, and/or any circuits (e.g., network card, modem, etc.) that enable computer system/server 12 to communicate with one or more other computing circuits. For example, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, circuit drivers, redundant processing units, external disk drive arrays, RAID systems, tape drives, and data archival storage systems, etc.

Figure 4:
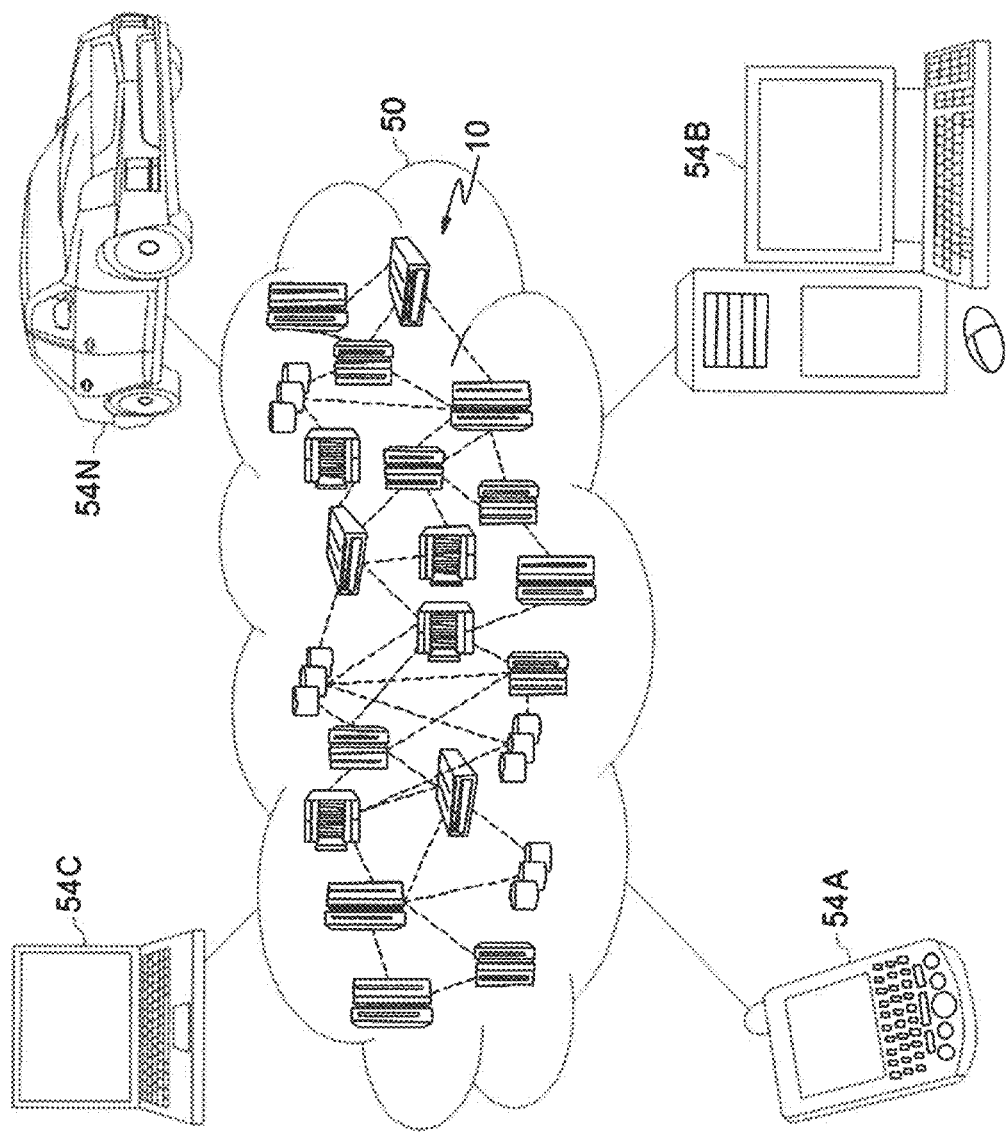
FIG. 4 depicts a cloud-computing environment 50 according to an embodiment of the present invention.

Referring now to FIG. 4, illustrative cloud computing environment 50 is depicted. As shown, cloud computing environment 50 comprises one or more cloud computing nodes 10 with which local computing circuits used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing circuit. It is understood that the types of computing circuits 54A-N shown in FIG. 4 are intended to be illustrative only and that computing nodes 10 and cloud computing environment 50 can communicate with any type of computerized circuit over any type of network and/or network addressable connection (e.g., using a web browser).

Figure 5:
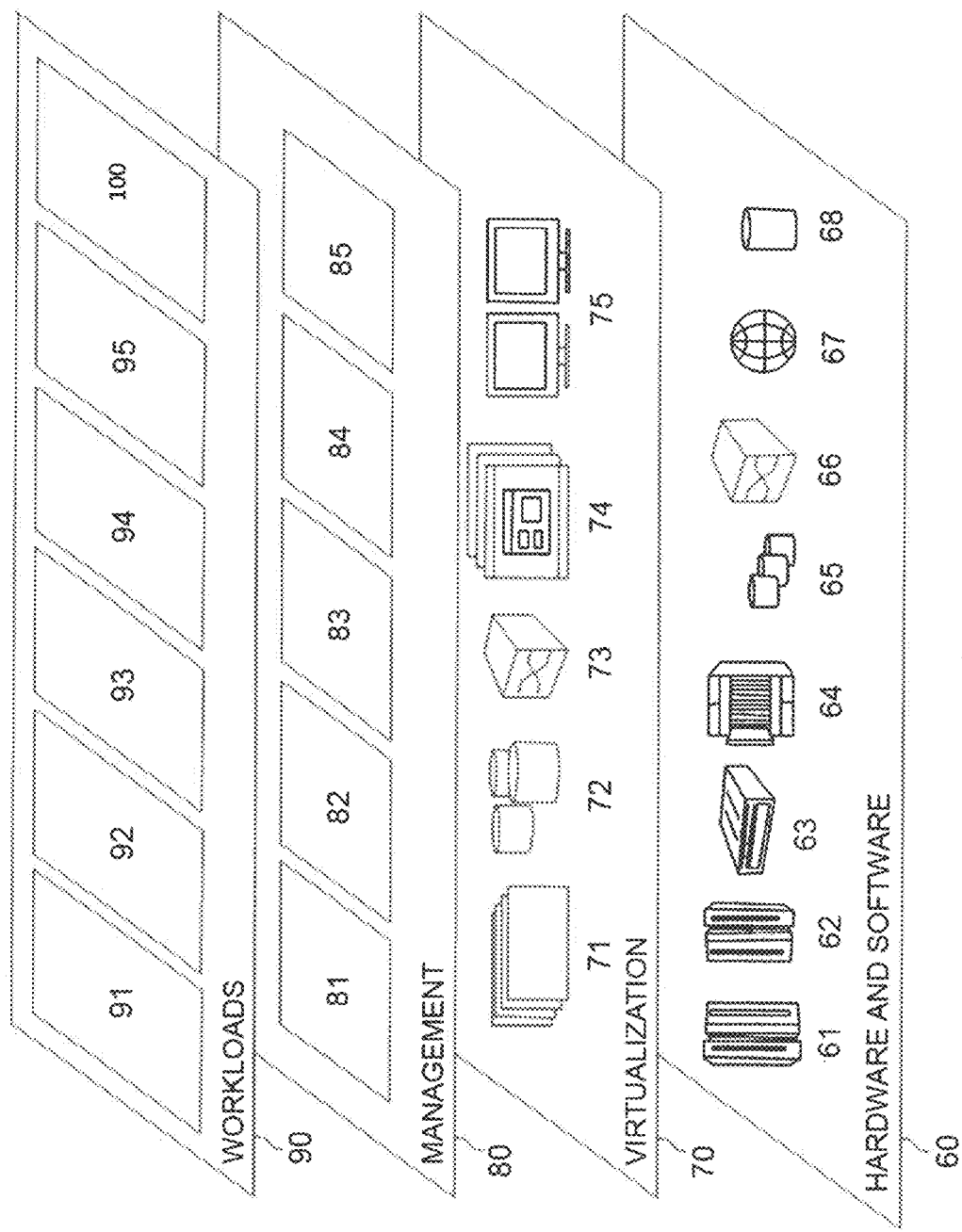
FIG. 5 depicts abstraction model layers according to an embodiment of the present invention.

Referring now to FIG. 5, an exemplary set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage circuits 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Floating gate setup method 100 in accordance with the present invention.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), a Storage Area Network (SAN), a Network Attached Storage (NAS) device, a Redundant Array of Independent Discs (RAID), an erasable programmable read-only memory (EPROM or Flash memory), a static random access memory (SRAM), a portable compact disc read-only memory (CD-ROM), a digital versatile disk (DVD), a memory stick, a USB "thumb" drive, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A computer-implemented method, the method comprising:
   in an initial setup of weights for a floating gate including rows, columns, and a separate input line:
      comparing a current weight to a desired weight;
      performing a feedback to the input line to set a voltage to change the floating gate field effect transistor (FET) threshold voltage (VT) and the current weight; and
      checking that the current weight is within a predetermined tolerance of the desired weight,
   wherein, in the initial setup of the weights, the weights are set by:
      floating a second row and a third row;
      floating a second column third column, and a fourth column; and
      setting a first input line to a predetermined voltage (VDD).

2. The method of claim 1, further comprising, in the initial setup of the weights:
   reading the voltage applied to a first row to read a current from the first column; and
   converting the voltage and the current to a digital value.

3. The method of claim 2, further comprising, in the initial setup of the weights:
   in the comparing, comparing the current of the first column to a desired value of current corresponding to the desired weight to calculate a needed voltage to be applied to the input line in the feedback to obtain the desired weight.

4. The method of claim 3, further comprising, in the initial setup of the weights:
   applying the needed voltage to the input line, with the first row, the second row, the third row and the second column, the third column, and the fourth column set as a different voltage between the input line voltage and a second predetermined voltage (GND) with the first column grounded.

5. The method of claim 4, wherein, in the initial setup of the weights,
   the applying is repeated until the desired weight is obtained.

6. The method of claim 5, wherein, in the initial setup of the weights, each step is repeated for each of the weights in layers and on other layers of the floating gate, and also multiple parallel update of unit cell.

7. The method of claim 6, wherein, during inference, all the input lines are set to the predetermined voltage (VDD) and the desired value is input into an input layer of a neural network to obtain the output from an output layer of neural network.

8. The method of claim 1, wherein the floating gate comprises a cross-bar configuration for an analog memory.

9. The computer-implemented method of claim 1, embodied in a cloud-computing environment.

10. A computer program product for floating gate, the computer program product comprising a computer-readable storage medium having program instructions embodied therewith, the program instructions executable by a computer to cause the computer to perform:
    in an initial setup of weights for a floating gate including rows, columns, and a separate input line:
       comparing a current weight to a desired weight;
       performing a feedback to the input line to set a voltage to change the floating gate field effect transistor (FET) threshold voltage (VT) and the current weight; and
       checking that the current weight is within a predetermined tolerance of the desired weight,
    wherein, in the initial setup of the weights, the weights are set by:
       floating a second row and a third row;
       floating a second column, a third column, and a fourth column; and
       setting a first input line to a predetermined voltage (VDD).

11. The computer program product of claim 10, further comprising, in the initial setup of the weights:
    reading the voltage applied to a first row to read a current from the first column; and
    converting the voltage and the current to a digital value.

12. The computer program product of claim 11, further comprising, in the initial setup of the weights:
    in the comparing, comparing the current of the first column to a desired value of current corresponding to the desired weight to calculate a needed voltage to be applied to the input line in the feedback to obtain the desired weight.

13. The computer program product of claim 12, further comprising, in the initial setup of the weights:
    applying the needed voltage to the input line, with the first row, the second row, the third row and the second column, the third column, and the fourth column set as a different voltage between the input line voltage and a second predetermined voltage (GND) with the first column grounded.

14. The computer program product of claim 13, wherein, in the initial setup of the weights,
    the applying is repeated until the desired weight is obtained.

15. The computer program product of claim 14, wherein, in the initial setup of the weights, each step is repeated for each of the weights in layers and on other layers of the floating gate, and also multiple parallel update of unit cell.

16. The computer program product of claim 15, wherein, during inference, all the input lines are set to the predetermined voltage (VDD) and the desired value is input into an input layer of a neural network to obtain the output from an output layer of neural network.

17. A Floating gate setup system on a cluster environment, said system comprising:
- a processor; and
- a memory, the memory storing instructions to cause the processor to perform:
  - in an initial setup of weights for a floating gate including rows, columns, and a separate input line:
    - comparing a current weight to a desired weight;
    - performing a feedback to the input line to set a voltage to change the floating gate field effect transistor (FET) threshold voltage (VT) and the current weight; and
    - checking that the current weight is within a predetermined tolerance of the desired weight,
  - wherein, in the initial setup of the weights, the weights are set by:
    - floating a second row and a third row;
    - floating a second column, a third column, and a fourth column; and
    - a first input line to a predetermined voltage (VDD).

18. The system of claim 17, embodied in a cloud-computing environment.

* * * * *